United States Patent
Huang (10) Patent No.: US 11,854,624 B2
(45) Date of Patent: Dec. 26, 2023

(54) NON-VOLATILE MEMORY DEVICE AND ERASING OPERATION METHOD THEREOF

(71) Applicant: Winbond Electronics Corp., Taichung (TW)

(72) Inventor: Koying Huang, San Jose, CA (US)

(73) Assignee: Winbond Electronics Corp., Taichung (TW)

( * ) Notice: Subject to any disclaimer, the term of this patent is extended or adjusted under 35 U.S.C. 154(b) by 183 days.

(21) Appl. No.: 17/530,422

(22) Filed: Nov. 18, 2021

(65) Prior Publication Data

US 2023/0154543 A1 May 18, 2023

(51) Int. Cl.
| | |
|---|---|
| *G11C 16/16* | (2006.01) |
| *G11C 16/04* | (2006.01) |
| *G11C 16/34* | (2006.01) |
| *H10B 41/35* | (2023.01) |

(52) U.S. Cl.
CPC .......... *G11C 16/16* (2013.01); *G11C 16/0433* (2013.01); *G11C 16/3445* (2013.01); *H10B 41/35* (2023.02)

(58) Field of Classification Search
CPC .. G11C 16/16; G11C 16/0433; G11C 16/3445
USPC .................................................... 365/185.17
See application file for complete search history.

(56) References Cited

U.S. PATENT DOCUMENTS

| | | | |
|---|---|---|---|
| 5,898,621 A | 4/1999 | Takahashi et al. | |
| 9,136,009 B1* | 9/2015 | Lu ..................... | G11C 16/0408 |
| 10,643,710 B2* | 5/2020 | Prasad ................. | G11C 29/028 |
| 11,361,825 B2* | 6/2022 | Liikanen ............ | G11C 16/3459 |
| 2005/0052908 A1 | 3/2005 | Tomoeda et al. | |
| 2009/0279360 A1 | 11/2009 | Lee et al. | |
| 2014/0347922 A1* | 11/2014 | Hong .................. | G11C 16/3445 365/185.02 |
| 2016/0078928 A1 | 3/2016 | Lee | |
| 2021/0382647 A1 | 12/2021 | Lee | |
| 2022/0383966 A1* | 12/2022 | Huang ................... | G11C 16/08 |

FOREIGN PATENT DOCUMENTS

| | | |
|---|---|---|
| CN | 100498976 | 6/2009 |
| TW | I543172 | 7/2016 |

OTHER PUBLICATIONS

"Office Action of Taiwan Counterpart Application", dated Feb. 3, 2023, pp. 1-9.

\* cited by examiner

*Primary Examiner* — Connie C Yoha
(74) *Attorney, Agent, or Firm* — JCIPRNET (57) ABSTRACT

A non-volatile memory device and a non-volatile memory erasing operation method is provided. The method includes the following. A first erasing operation is performed, including reducing a threshold voltage of each of a plurality of memory cells of the non-volatile memory through a first erasing pulse. A first verification operation is performed to confirm whether the threshold voltage of each of the memory cells is less than an erasing target voltage level. In response to at least one of the memory cells failing the first verification operation, a second erasing operation is performed. The second erasing operation includes selecting the at least one memory cell failing the first verification operation, and reducing the threshold voltage of the at least one memory cell to be less than the erasing target voltage level through a second erasing pulse.

16 Claims, 11 Drawing Sheets

NON-VOLATILE MEMORY DEVICE AND ERASING OPERATION METHOD THEREOF

BACKGROUND

Technical Field

The disclosure relates to non-volatile memory, and particularly to an erasing operation method of non-volatile memory.

Description of Related Art in some applications, an erasing procedure is required to be performed on the flash memory before the flash memory is programmed. In the erasing procedure, the threshold voltage of each memory cell is typically reduced by applying an erasing pulse to be shifted toward a target voltage level. After the erasing pulse is applied, a verification operation may be performed to confirm whether the target memory cells have all been erased (i.e., the threshold voltage is less than the target voltage level).

Figure 1A:
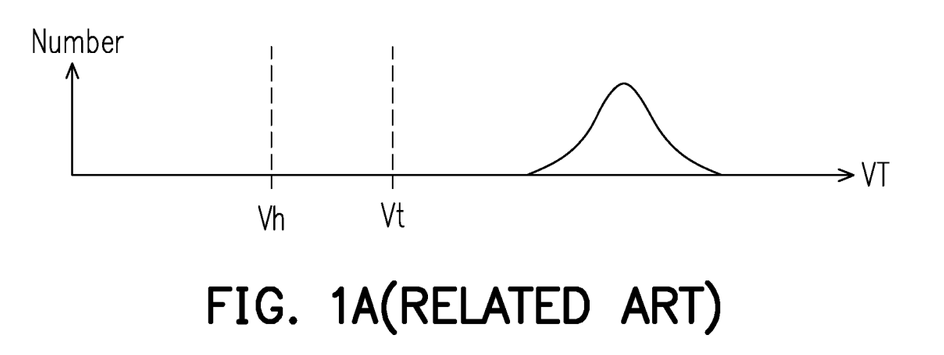
FIG. 1A to FIG. 1C are distribution diagrams of the threshold voltages and number of target memory cells in a conventional erasing operation.
Figure 1B:
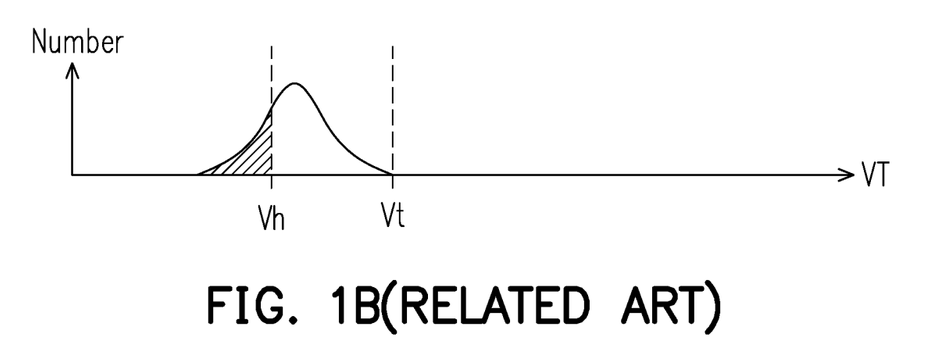
Figure 1C:
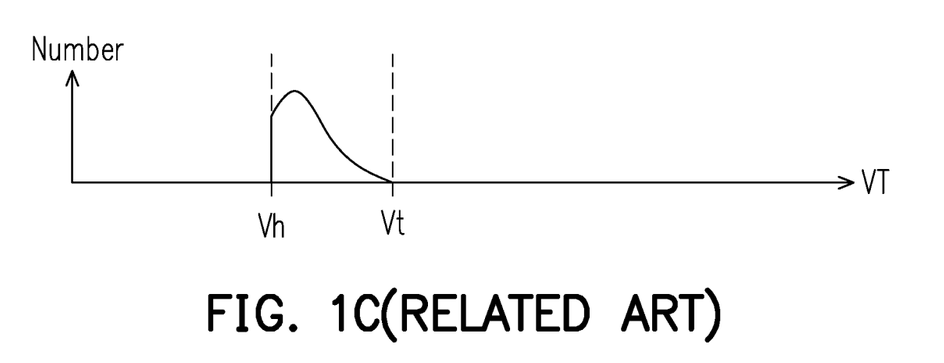

FIG. 1A to FIG. 1C are distribution diagrams of the threshold voltages and number of target memory cells in a conventional erasing operation, where the horizontal axis represents a threshold voltage VT, and the vertical axis represents the number of target memory cells. The target memory cells in FIG. 1A are in a programmed state. As can be seen, the number of target memory cells is the greatest at the wave peak and is reduced toward both sides. Next, an erasing pulse is applied to the target memory cells to reduce their threshold voltages VT. To make the threshold voltages VT of all of the target memory cells less than a target voltage level Vt, it may be necessary to perform multiple times of erasing operations and verification operations, and the final distribution of target memory cells is presented as shown in FIG. 1B. With reference to FIG. 1B to make the threshold voltages VT of all of the target memory cells less than the target voltage level Vt, it causes some of the target memory cells (see the part shown by slanted lines) to be over erased, that is, the threshold voltage VT is less than an erasing threshold voltage level Vh. Moreover, during the erasing operation, the distribution range of the threshold voltages of the target memory cells may become wider (a collapse of the curve of FIG. 1B, imaginably), resulting in an even greater number of over erased target memory cells. The target over erased memory cells may have no effect on subsequent programming operations, so that the correct operation result cannot be obtained. Furthermore, the over erased target memory cells may have a leakage current, which may interfere with subsequent reading and programming results. To prevent this, the conventional approach includes performing a post-programming operation on the over erased target memory cells (as shown by slanted lines in FIG. 1B) to increase their threshold voltages VT. The distribution of target memory cells after the post-programming operation is as shown in FIG. 1C.

In other words, at least the over erasing of target memory cells during an erasing process, and the requirement of a subsequent post-programming operation exist in the conventional art. Furthermore, in a case where the post-programming operation cannot be performed or is interrupted due to an incident (e.g., a power failure or drop) after the erasing operation is performed, the target memory cells are still in the over erased state and leakage current may still exist, which may affect the reading results of other memory cells. Therefore, how to alleviate the over erased circumstance of memory cells during the erasing procedure has been a topic of concern to those skilled in the art.

SUMMARY

The disclosure provides a non-volatile memory device and an erasing operation method thereof, in which over erasing of target memory cells can be solved.

An erasing operation method of non-volatile memory of the disclosure includes the following. A first erasing operation is performed, including reducing a threshold voltage of each of a plurality of memory cells of the non-volatile memory through a first erasing pulse. A first verification operation is performed to confirm whether the threshold voltage of each of the plurality of memory cells is less than an erasing target voltage level. In response to at least one of the plurality of memory cells failing the first verification operation, a second erasing operation is performed. The second erasing operation includes selecting the at least one memory cell failing the first verification operation, and reducing the threshold voltage of the at least one memory cell to be less than the erasing target voltage level through a second erasing pulse.

A non-volatile memory device of the disclosure includes a plurality of memory cells and an operating circuit. The operating circuit is configured to: perform a first erasing operation, including reducing a threshold voltage of each of the plurality of memory cells through a first erasing pulse, and perform a first verification operation to confirm whether the threshold voltage of each of the plurality of memory cells is less than an erasing target voltage level. The operation operating circuit also performs a second erasing operation in response to at least one of the plurality of memory cells failing the first verification, including selecting the at least one of the plurality of memory cells failing the first verification operation by the operating circuit, and reducing the threshold voltage of the at least one of the plurality of memory cells to be less than the erasing target voltage level through a second erasing pulse.

Based on the above, over erasing of the target memory cells can be solved.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Several embodiments will be described below. A first embodiment is provided to alleviate over erasing of target memory cells in an erasing procedure. The second embodiment is provided to solve leakage current in the over erased target memory cell. The third embodiment is an extended embodiment. The first to third embodiments are each implemented at a target of non-volatile memory, particularly flash memory, and more particularly NOR flash memory.

Figure 2A:
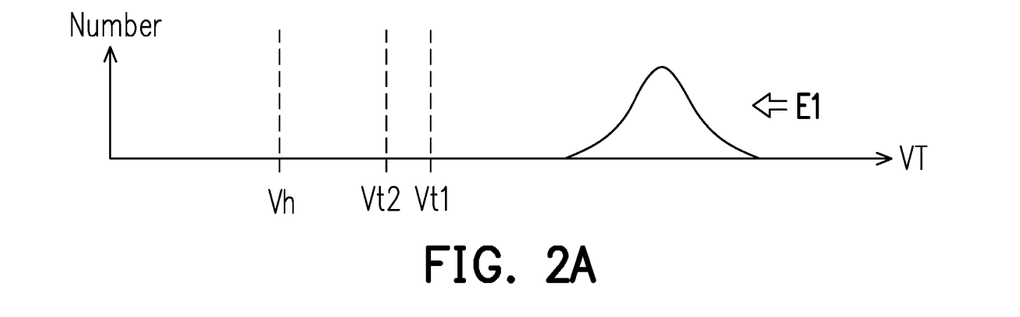
FIG. 2A to FIG. 2D are distribution diagrams of the threshold voltages and number of target memory cells under an erasing operation according to a first embodiment of the disclosure.
Figure 2B:
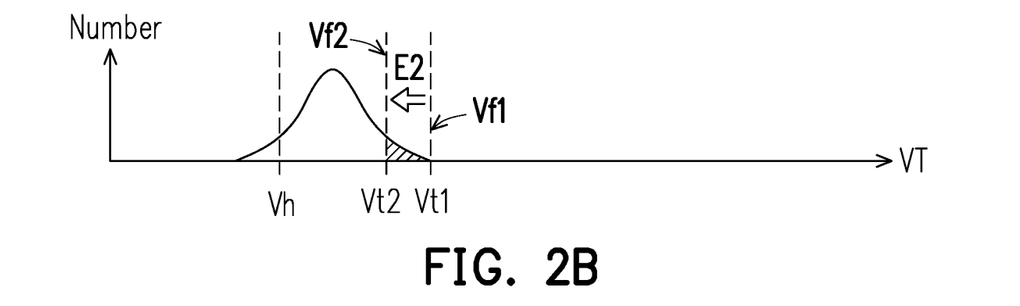

FIG. 2A to FIG. 2D are distribution diagrams of the threshold voltages and number of target memory cells under an erasing operation according to a first embodiment of the disclosure, where the horizontal axis represents the threshold voltage VT, and the vertical axis represents the number of target memory cells. With reference to FIG. 2A, the target memory cells in FIG. 2A is in a programmed state. As can be seen, the number of target memory cells is the greatest at the wave peak and is reduced toward both sides. Next, an operating circuit of the non-volatile memory performs an erasing operation E1 on (i.e., applying an erasing pulse to) all of the target memory cells to reduce the threshold voltages VT taking a first target voltage level Vt1 as the target, where the first target voltage level Vt1 is greater than an erasing target voltage level Vt2. To make the threshold voltages VT of all of the target memory cells less than the first target voltage level Vt1, the operating circuit may need to perform the erasing operation E1 and a verification operation vf1 multiple times. Specifically, in a case where any target memory cell fails the verification operation vf1 (the threshold voltage VT being greater than or equal to the first target voltage level Vt1), the operating circuit performs the erasing operation E1 on all of the target memory cells again, and performs the verification operation vf1 again. The above processes are repeated until the threshold voltages VT of all of the target memory cells are less than the first target voltage level Vt1, and the final distribution of the target memory cells is presented as shown in FIG. 2B.

Figure 2C:
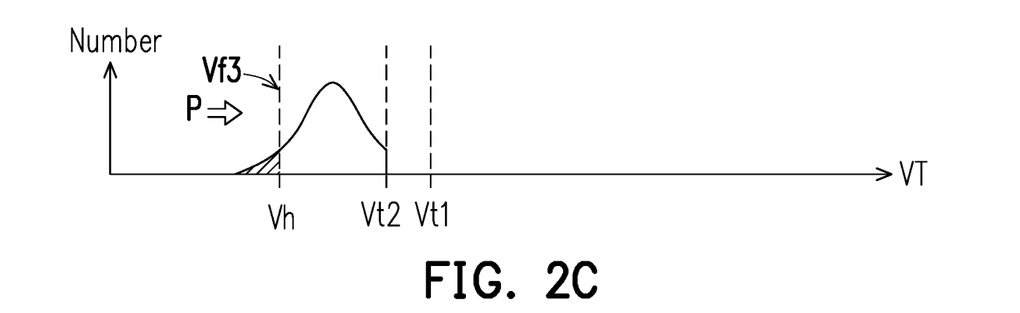
Figure 2D:
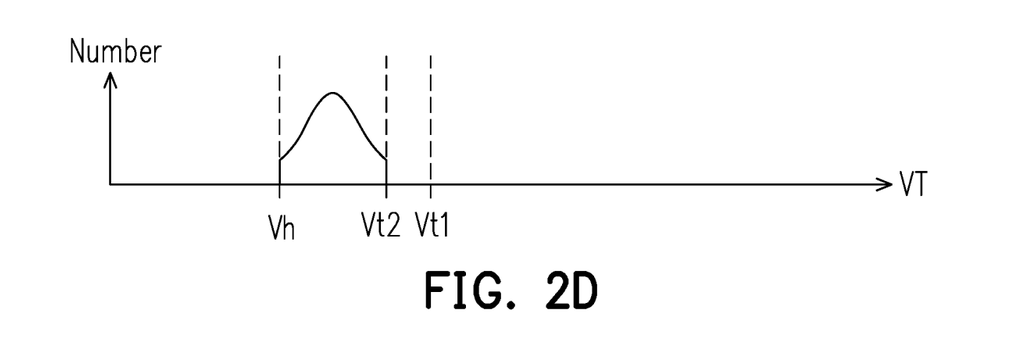

With reference to FIG. 2B, after all of the target memory cells pass the verification operation vf1 (the threshold voltage VT is less than the first target voltage level Vt1), the operating circuit performs a verification operation vf2 on all of the target memory cells to confirm whether the threshold voltage VT of each target memory cell is less than the erasing target voltage level Vt2. Next, the operating circuit selects the target memory cell that fails the verification operation vf2, and performs an erasing operation E2 thereon. Different from the erasing operation E1 whose object is all of the target memory cells, the erasing operation E2 is only directed to the target memory cell that fails the verification operation vf2 (the threshold voltage VT is greater than the erasing target voltage level Vt2, as shown by slanted lines), and the distribution of the target memory cells is presented as shown in FIG. 2C. With reference to FIG. 2C, the operating circuit performs a verification operation Vf3 on all of the target memory cells to confirm whether the threshold voltage VT of each target memory cell is not less than the erasing threshold voltage level Vh, where the erasing threshold voltage level Vh is less than the erasing target voltage level Vt2. The target memory cell whose threshold voltage VT is less than the erasing threshold voltage level Vh is over erased. Next, the operating circuit selects the target memory cell that fails the verification operation Vf3 (the threshold voltage VT less than the erasing threshold voltage level Vh) to perform a post-programming operation P to increase the threshold voltage VT of the target memory cell to at least the erasing threshold voltage level Vh, and the final distribution of the target memory cells is presented as shown in FIG. 2D.

Different from the conventional art of performing an erasing operation taking the erasing target voltage level Vt2 as a reference, in the first embodiment, the erasing operation E1 is first performed taking the first target voltage level Vt1 (greater than the erasing target voltage level Vt2) as a reference. Accordingly, the number of over erased target memory cells may be less than the conventional art. Jointedly, there may not be as many target memory cells that need to be performed with the post-programming operation P, and the distribution range of the threshold voltages of the target memory cells may be narrower. Moreover, the wave peak of the curve in FIG. 1C is at a position closer to the erasing threshold voltage level Vh, while the wave peak of the curve in FIG. 2D is farther from the erasing threshold voltage level Vh. This means that the threshold voltages VT of most target memory cells may not be overly close to the erasing threshold voltage level Vh.

Furthermore, in the first embodiment, the erasing operation E2 is performed to selectively pull down the threshold voltage VT of the target memory cell that fails the verification operation vf2 (taking the erasing target voltage level Vt2 as a basis) to the erasing target voltage level Vt2. In the first embodiment, the erasing operation E1 includes injecting holes into a floating gate of each target memory cell through a hole injection method of Fowler-Nordheim tunneling (FN tunneling) to reduce the threshold voltage VT of each target memory cell. The erasing operation E2 includes injecting holes into the floating gate of the selected memory cell that fails the verification operation vf2 through a hole injection method of band to band hot hole injection (BBHHI) to reduce the threshold voltage VT of the selected target memory cell.

Figure 3A:
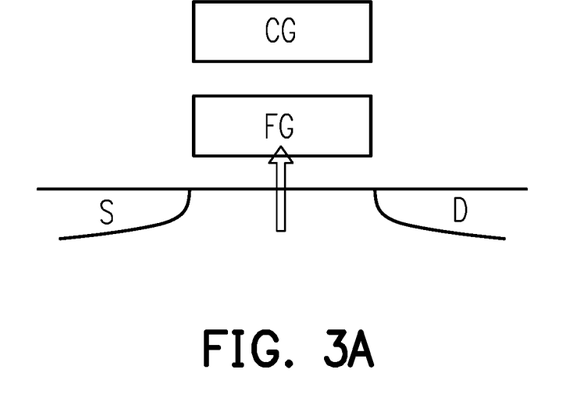
FIG. 3A is a schematic operation diagram of the hole injection method of Fowler-Nordheim tunneling on a target memory cell.
Figure 3B:
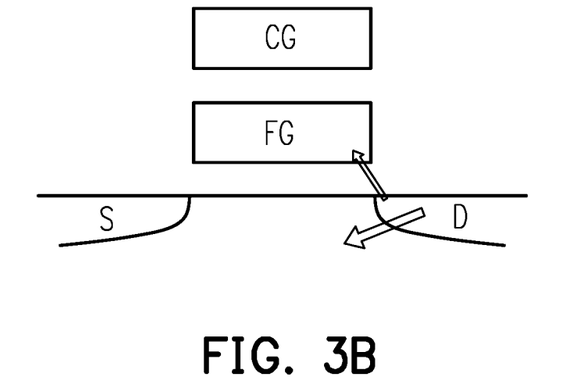
FIG. 3B is a schematic operation diagram of the hole injection method of band to band hot hole injection on a target memory cell.

FIG. 3A is a schematic operation diagram of the hole injection method of Fowler-Nordheim tunneling on a target memory cell. FIG. 3B is a schematic operation diagram of the hole injection method of band to band hot hole injection on a target memory cell. With reference to FIG. 3A, a control gate CG of the target memory cell is electrically connected to a word line. During an erasing operation performed by utilizing the Fowler-Nordheim tunneling hole injection mechanism, the operating circuit may apply a relatively high negative voltage (e.g., −5V to −12V) to the control gate CG through the word line, and may apply a relatively low positive voltage (e.g., 5V to 6V) to a source S (or a drain D) to trigger the Fowler-Nordheim tunneling effect. Accordingly, electron holes are attracted from the source (or drain) to a floating gate and tunnel through the tunneling oxide layer (ie. band to band). Through the above operations, the threshold voltage of the target memory cell can be reduced to complete the erasing on the target memory cell. With reference to FIG. 3B, during an erasing operation performed by the operating circuit by utilizing the band to band hot hole injection mechanism, when the control gate is negatively biased and the drain is positively biased, the surface depletion region of the n+ type drain collapses and electron-hole pairs are generated. The electrons flow toward the drain, and the holes pass through the oxide layer and are injected into the floating gate to achieve erasing. Generally speaking, compared to the hole injection method of Fowler-Nordheim tunneling, since the hole injection method of band to band hot hole injection has a lower current utilization rate (the drain current is much greater than the gate current), a greater current is thus required for the operation, causing a burden on the charge pump. However, in the first embodiment, since the erasing operation E2 is performed only on the selected target memory cell, it may not cause an overly great burden on the charge pump.

Figure 4A:
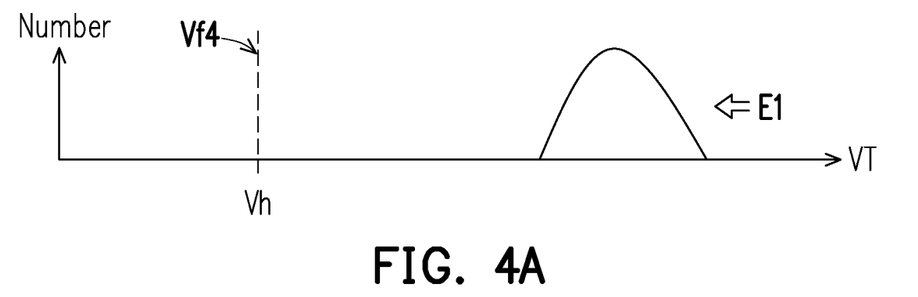
FIG. 4A to FIG. 4C are distribution diagrams of the threshold voltages and number of target memory cells under an erasing operation according to a second embodiment of the disclosure.
Figure 4B:
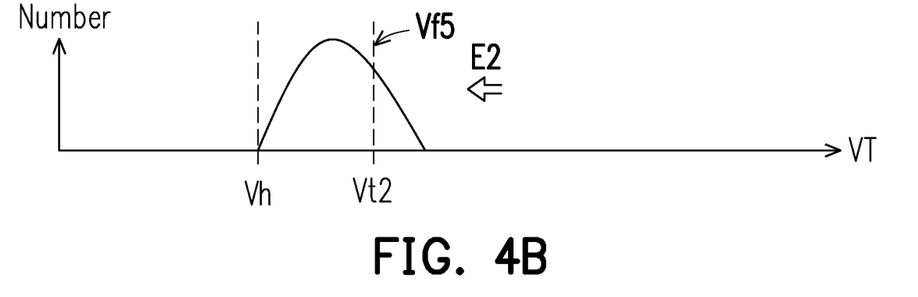

FIG. 4A to FIG. 4C are distribution diagrams of the threshold voltages and number of target memory cells under an erasing operation according to a second embodiment of the disclosure, where the horizontal axis represents the threshold voltage VT, and the vertical axis represents the number of target memory cells. With reference to FIG. 4A, the target memory cells in FIG. 4A are in a programmed state. As can be seen, the number of target memory cells is the greatest at the wave peak and is reduced toward both sides. Next, the operating circuit of the non-volatile memory performs the erasing operation E1 on (i.e., applies an erasing pulse to) all of the target memory cells to reduce the threshold voltage VT at a target of the erasing threshold voltage level Vh. The operating circuit may need to perform the erasing operation E1 and a verification operation vf4 multiple times to reduce the threshold voltage VT of at least one target memory cell to the erasing threshold voltage level Vh. Performing the verification operation vf4 serves to confirm whether the threshold voltage VT of any target memory cell is reduced to the erasing threshold voltage level Vh. Specifically, in a case where all of the target memory cells fail the verification operation vf4 (the threshold voltage VT is greater than the erasing threshold voltage level Vh), the operating circuit performs the erasing operation E1 on all of the target memory cells again, and performs the verification operation vf4 again. The above processes are repeated until the threshold voltage VT of at least one target memory cell is reduced to the erasing threshold voltage level Vh, and the final distribution of the target memory cells is presented as shown in FIG. 4B.

Figure 4C:
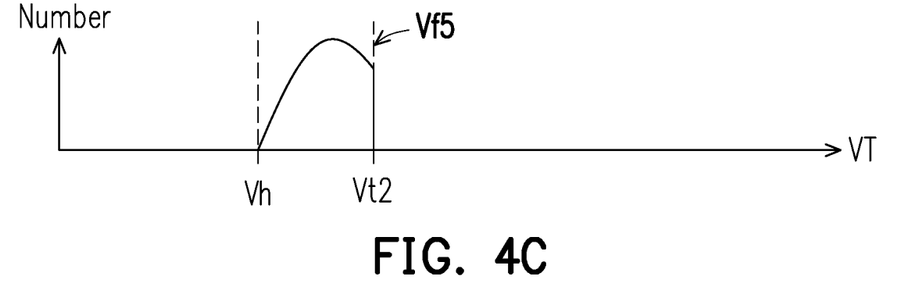

With reference to FIG. 4B, the operating circuit then performs a verification operation Vf5 on all of the target memory cells to confirm whether the threshold voltage VT of each target memory cell is less than the erasing target voltage level Vt2. The operating circuit selects the target memory cell that fails the verification operation Vf5 to perform the erasing operation E2 to pull down the threshold voltage VT of the selected target memory cell. Similar to the first embodiment, the erasing operation E1 includes injecting holes into the floating gate of each target memory cell through the hole injection method of Fowler-Nordheim tunneling to reduce the threshold voltage VT of each target memory cell. The erasing operation E2 includes injecting holes into the floating gate of the selected memory cell that fails the verification operation vf2 through the hole injection method of band to band hot hole injection to reduce the threshold voltage VT of the selected target memory cell, and the final distribution of the target memory cells is presented as shown in FIG. 4C. Moreover, since the erasing operation E2 is performed only on the selected target memory cell, it may not cause an overly great burden on the charge pump. In addition, the arrangement of the erasing operation E2 is not only used to prevent the occurrence of an over erased condition, but can also be used to restore the memory cell(s) whose Vth has moved up after the cycle disturbance.

Unlike the erasing operation in the first embodiment, which is performed taking the first target voltage level Vt1 as a reference, the erasing operation E1 in the second embodiment is directly performed taking the erasing threshold voltage level Vh as a reference. As a result, an over erased target memory cell may not be present, and a post-programming operation is not required to be performed. Accordingly, even in a case where the post-programming operation cannot be performed or is interrupted due to an incident (e.g., a power failure) after the erasing operation is performed, the target memory cell may not have a leakage current. In other words, the leakage current of the target memory cell can be fundamentally solved. Moreover, the wave peak of the curve in FIG. 1C is at a position closer to the erasing threshold voltage level Vh, while the wave peak of the curve in FIG. 4C is farther from the erasing threshold voltage level Vh. This means that the threshold voltages VT of most target memory cells may not be overly close to the erasing threshold voltage level Vh.

Figure 5:
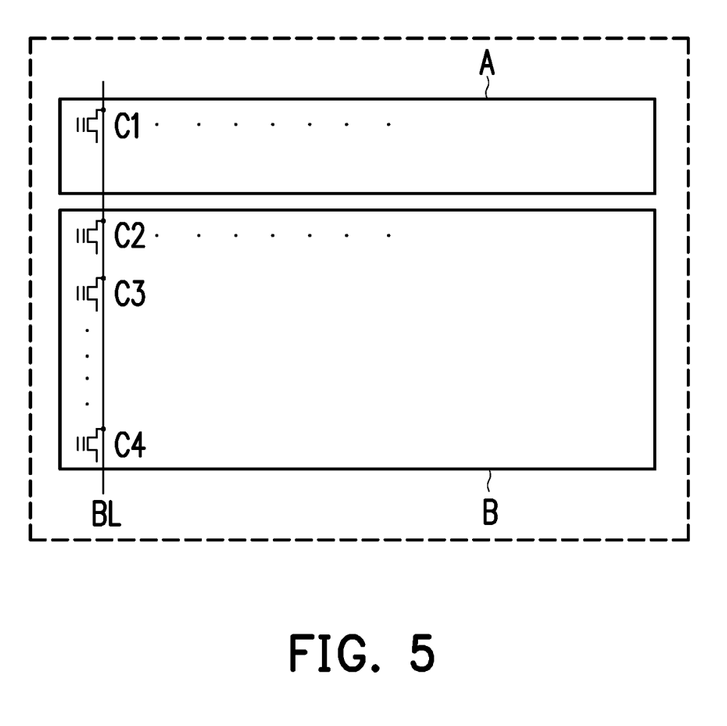
FIG. 5 is a schematic diagram of a memory cell array according to the third embodiment of the disclosure.

The third embodiment is an extended embodiment. Before description of the third embodiment, the conventional art is described first. FIG. 5 is a schematic diagram of a memory cell array according to the third embodiment of the disclosure. Although FIG. 5 shows only memory cells C1 to C4 that share a bit line BL, there may be actually more memory cells to form the memory cell array. With reference to FIG. 5, a sector A is selected for programming and erasing operations, while a sector B is not selected. The sector A and the sector B are in the same well. Since the memory cells C1 to C4 share the bit line BL, during the cyclic operations of programming and erasing the sector A (i.e., performing programming, erasing, programming, erasing . . . ), the memory cells in the sector B may also be interfered with, causing a change in their threshold voltages. Accordingly, there may exist erroneous determination on the storage status of the memory cells in the sector B, which is not selected to be performed with the operations. Description accompanied with multiple diagrams will be made below.

Figure 6A:
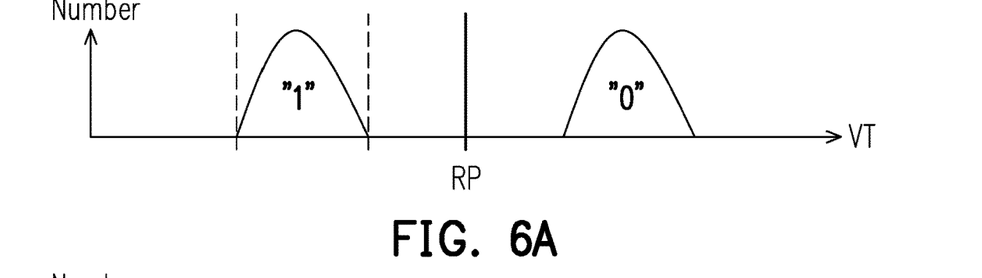
FIG. 6A and FIG. 6B are distribution diagrams of the threshold voltages and number of memory cells in the sector B.
Figure 6B:
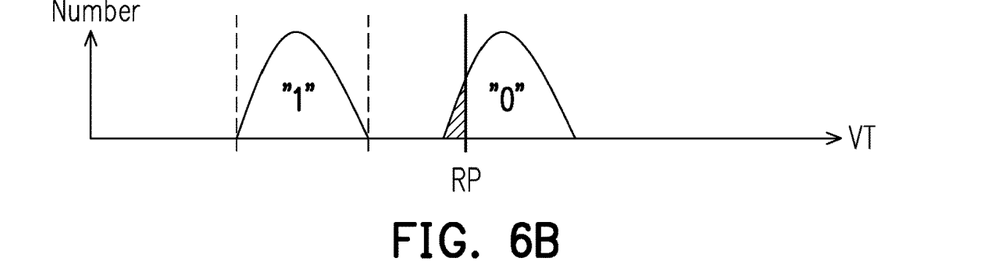

FIG. 6A and FIG. 6B are distribution diagrams of the threshold voltages and number of memory cells in the sector B, where the horizontal axis represents the threshold voltage VT, and the vertical axis represents the number of memory cells. With reference to FIG. 5 and FIG. 6A together, at first, a group of memory cells on the right side of a trip point RP are in the programmed state (read "0"), another group of memory cells on the left side of the trip point RP is in the erased state (read "1"). With reference to FIG. 6B, during the cyclic operations of programming and erasing the memory cells in the sector A, the threshold voltages of the programmed memory cells in the sector B (on the right side of the read trip point RP) may be affected and pulled down, and even partially pulled down to the left side of the trip point RP (as shown by slanted lines), thus causing errors in the subsequent determination.

Figure 6C:
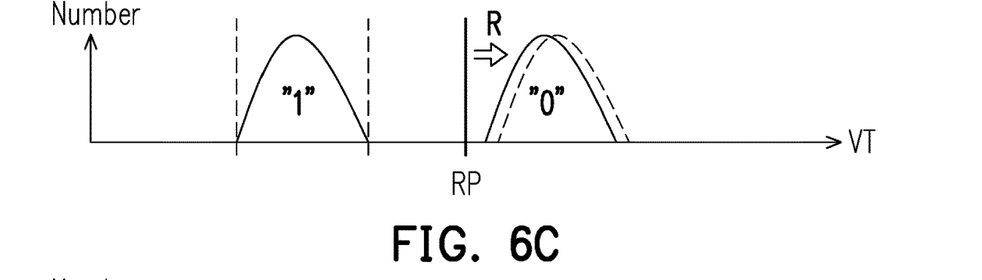
FIG. 6C to FIG. 6E are distribution diagrams of the threshold voltages and number of memory cells in the sector B according to the third embodiment in the disclosure.
Figure 6D:
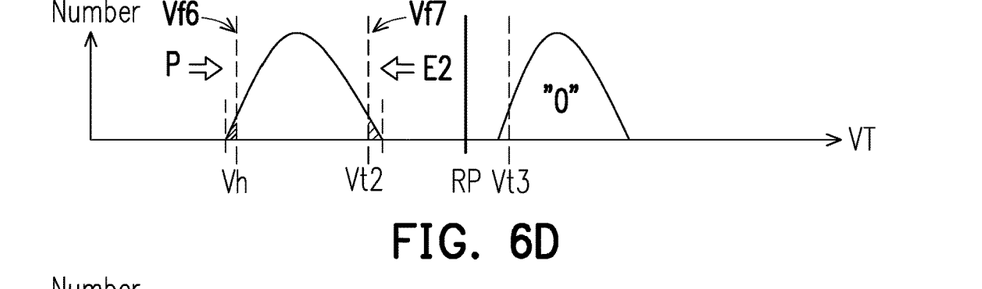
Figure 6E:
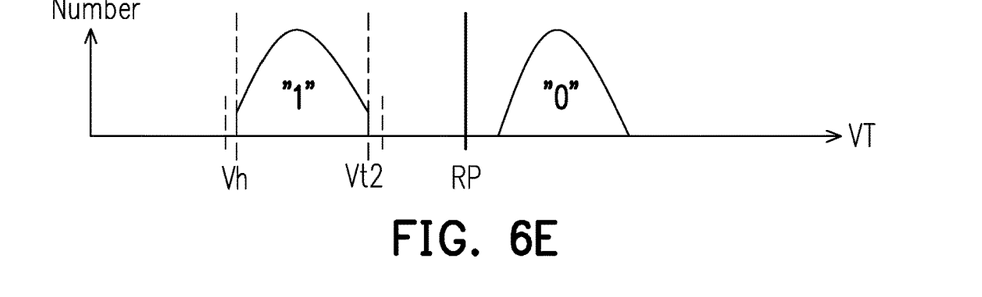

FIG. 6C to FIG. 6E are distribution diagrams of the threshold voltages and number of memory cells in the sector B according to the third embodiment in the disclosure. The third embodiment provides a solution to prevent that the threshold voltages of the programmed memory cells in the sector B may be affected and pulled down to the left side of the read trip point RP, causing errors in the subsequent determination. With reference to FIG. 6C, after multiple times of erasing operations are performed on the sector A, the distribution of the threshold voltages of the programmed memory cells in the sector B may be affected and gradually moved down (the magnitude of each downward move is, for example, the range as shown by the arrow in FIG. 6C). In this regard, in the third embodiment, after each time of erasing operation performed on the sector A, the operating circuit of the non-volatile memory confirms the storage status of the memory cells in the sector B through a read operation. In addition, the operating circuit performs a refresh operation R on all of the memory cells whose storage state is "0" in the sector B to increase their threshold voltages VT. The refresh operation may be performed using a channel hot electron (CHE) mechanism. In an embodiment, a voltage of 4V may be applied to the drain of the memory cell and a voltage of 9V may be applied to the control gate. Alternatively, the refresh operation is selectively performed on the memory cells whose threshold voltage VT is lower than a first target voltage level Vt3 (on the right side of the read trip point RP). However, description below is still made on the basis of FIG. 6C. In terms of FIG. 6C, through the refresh operation R, the operating circuit pushes the distribution range of the threshold voltages VT of all of the memory cells whose storage state is "0" in the sector B from a position shown by the solid line back to a position shown by the broken line. The refresh operation may be performed by positively biasing the bit line and negatively biasing the word line. After each time of erasing operation is performed on the sector A, since the refresh operation is performed on all of the memory cells whose storage state is "0" in the sector B, it may not be likely that the threshold voltages VT of all of the memory cells whose storage state is "0" in the sector B are moved down to the left side of the read trip point RP.

However, at the time of performing the refresh operation on the memory cells whose storage state is "0" in the sector B, the threshold voltages VT of the memory cells in the erased state (read "1") in the sector B may also be affected and moved upward (see the slanted line region in FIG. 6D), and the threshold voltages of some of the memory cells may be moved down (see the black region in FIG. 6D). In other words, the distribution range of the threshold voltages of the memory cells in the erased state in the sector B is widened toward both sides. There may exist an insufficient margin between the read trip point RP and the memory cells whose threshold voltage is moved up to the right side of the erasing target voltage level Vt2. The memory cells whose threshold voltage is move down to the left side of the erasing threshold voltage level Vh may have leakage current due to over erasing. The severity of the above is gradually increased currently as the size of the memory cell is continuously reduced. In this regard, in the third embodiment, the operating circuit performs a verification operation Vf6 taking the erasing threshold voltage level Vh as a reference. The operating circuit also selectively performs the post-programming operation P on the memory cells whose threshold voltage is less than the erasing threshold voltage level Vh (see the black region in FIG. 6D) in the sector B to move the threshold voltage VT of the memory cell or the memory cells upward to be equal to or greater than the erasing threshold voltage level Vh. The post-programming operation may be performed using a channel hot electron mechanism. In an embodiment, a voltage of 4V may be applied to the drain of the memory cell and a voltage of 0 to 3V may be applied to the gate (the control gate).

For the memory cells whose threshold voltage is moved up to the right side of the erasing target voltage level Vt2 (see the slanted line region in FIG. 6D), currently, it is only possible to perform an erasing operation on the entire sector B using, for example, a Fowler-Nordheim tunneling mechanism. However, this may cause the threshold voltages VT of all of the memory cells (including the memory cells whose storage state is "0") in the sector B to be moved down. It may be troublesome that the magnitude of downward move (which may move to the left side of the trip point RP) of the threshold voltages VT of the memory cells whose storage state is "0" cannot be grasped. In this regard, in the third embodiment, a verification operation Vf7 is performed taking the erasing target voltage level Vt2 as a reference, and the erasing operation E2 is selectively performed (using a band to band hot hole injection mechanism) on the memory cell that fails the verification operation Vf7, that is, the memory cell whose threshold voltage is moved up to the right side of the erasing target voltage level Vt2, to prevent affecting the threshold voltages VT of other memory cells located in the sector B. The erasing operation E2 may be performed using a band to band hot hole injection mechanism. In an embodiment, a target cell could be selected by applying a voltage of 4V to the drain and applying a voltage of −9V to the gate (the control gate). For a non-target cell(s) located on the same word line as the target cell, the non-target cell can be not selected by biasing the corresponding bit line to 0V. For a non-target cell(s) located on the same bit line as the target cell, the non-target cell can be not selected by biasing the corresponding word line to 0V. Regarding the description on the erasing operation E2 and the post-programming operation P, reference may be made to the first embodiment and the second embodiment, which will not be repeatedly described herein. Through the third embodiment, the final distribution of the threshold voltages and number of memory cells in the sector B is presented as shown in FIG. 6E. Accordingly, the threshold voltages VT of the memory cells affected by the operations on the sector A in the sector B can be restored to the desired range, and the distribution of the threshold voltages VT of the memory cells in the sector B can be maintained narrow.

Figure 7:
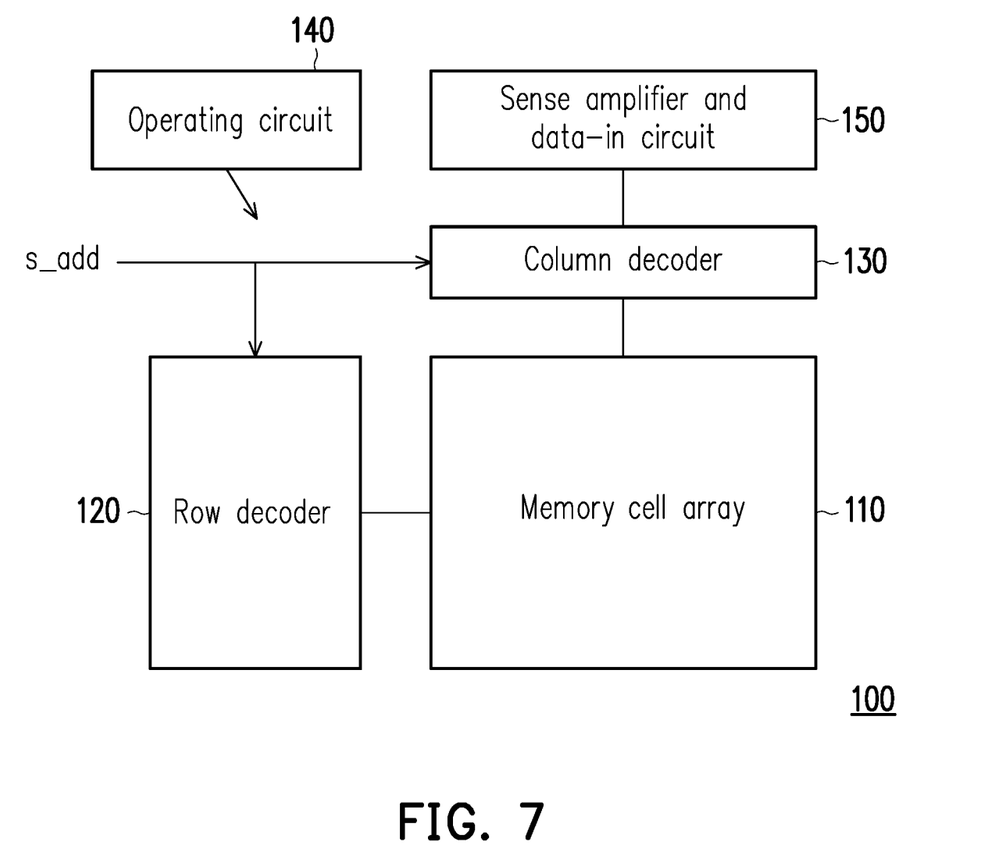
FIG. 7 is a schematic diagram of a hardware architecture of non-volatile memory generally adapted for the first embodiment to the third embodiment.

FIG. 7 is a schematic diagram of a hardware architecture of non-volatile memory generally adapted for the first embodiment to the third embodiment. With reference to FIG. 7, a device 100 includes a memory cell array 110, a row decoder 120, a column decoder 130, an operating circuit 140, and a sense amplifier and data-in circuit 150. In addition, the device 100 may also include a voltage generating circuit and other circuits (not shown), such as a general-purpose processor, a special-purpose application circuit, or an integrated module supported by non-volatile memory (memory cell array). An address signal S_add is provided to the column decoder 130 and the row decoder 120. The row decoder 120 is coupled to a plurality of word lines, and the word lines are arranged along each column in the memory cell array 110. The column decoder 130 is coupled to a plurality of bit lines, and the bit lines are arranged along each row in the memory cell array 110.

Through the bit lines and the word lines, data may be read from multi-bit memory cells in the memory cell array 110 and programmed. The sense amplifier and data-in circuit is coupled to the column decoder 130 through the bus. In a write operation, data is input to a data input circuit from an input/output port of the circuit through a data input line, or from other internal or external data sources of the circuit. In a read operation, data is output from the sense amplifier through a data output line to the input/output port of the circuit or to an external data destination.

Figure 8:
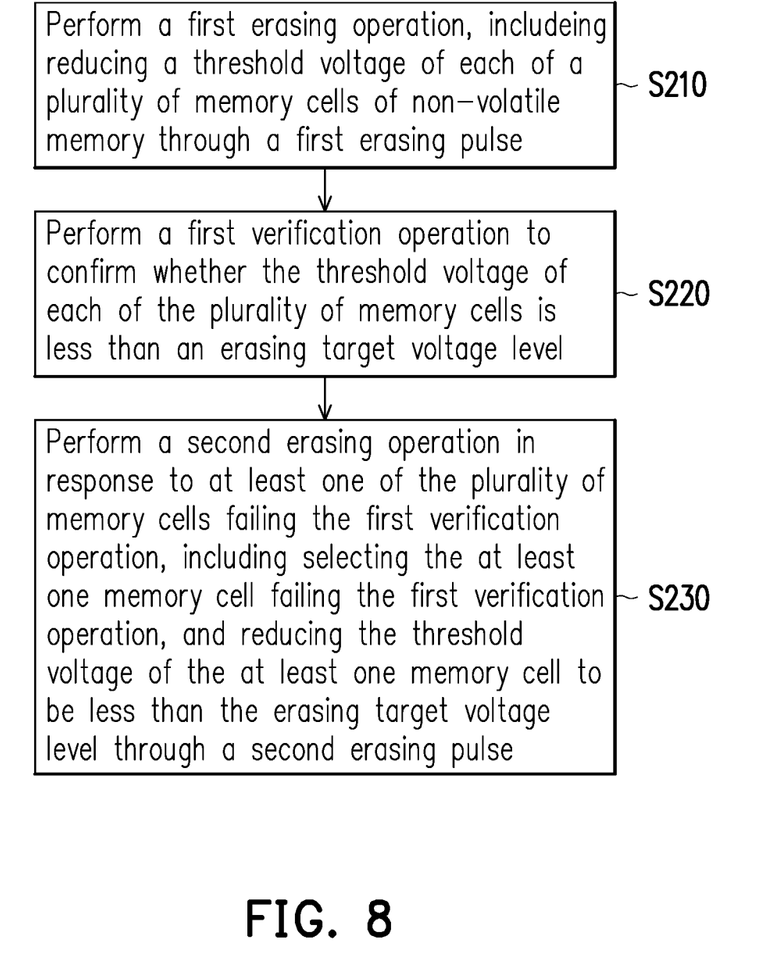
FIG. 8 is a flowchart of steps of performing the first erasing operation and the second erasing operation by the operating circuit of the disclosure.

The operating circuit 140 mainly serves to perform a first erasing operation and a second erasing operation on a target memory cell (the entirety or part of the memory cell array 110). The first erasing operation may refer to the erasing operation E1 in the first embodiment and the second embodiment. The second erasing operation may refer to the erasing operation E2 in the first embodiment, the second embodiment, and the third embodiment. FIG. 8 is a flowchart of steps of performing the first erasing operation and the second erasing operation by the operating circuit of the disclosure. With reference to FIG. 7 and FIG. 8 together, the operating circuit 140 performs a first erasing operation to reduce threshold voltages of a plurality of target memory cells through a first erasing pulse (step S210). After applying the first erasing pulse to the plurality of target memory cells, the operating circuit 140 may perform a first verification operation to confirm whether the threshold voltage of each target memory cell is less than an erasing target voltage level through the verification result (step S220). When the threshold voltage of each target memory cell is less than the erasing target voltage level, the first erasing operation is ended. However, due to the different erasing speeds of the target memory cells, some of the target memory cells with a slower erasing speed may fail the verification. The operating circuit 140 may perform a second erasing operation on the target memory cell that fails the verification (step S230). Specifically, the operating circuit 140 may select the target memory cell that fails the first verification operation and apply a second erasing pulse to the target memory cell to further reduce its threshold voltage to be less than the erasing target voltage level. The first verification operation may refer to the verification operation vf2 in the first embodiment, the verification operation vf5 in the second embodiment, and the verification operation vf7 in the third embodiment.

Figure 9:
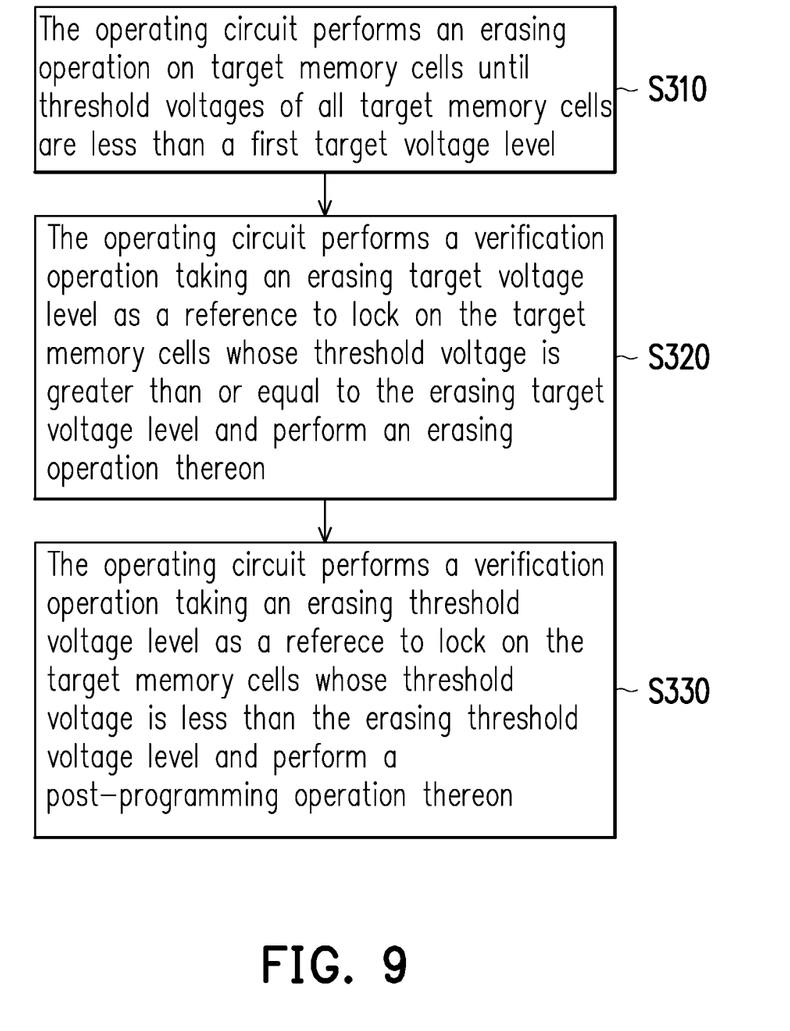
FIG. 9 is a flowchart of steps of performing the first embodiment by the operating circuit.

FIG. 9 is a flowchart of steps of performing the first embodiment by the operating circuit. With reference to FIG. 2A to FIG. 2D and FIG. 9 together, first, the operating circuit performs an erasing operation on target memory cells (i.e., the erasing operation E1 as shown in FIG. 2A) until threshold voltages of all of the target memory cells are less than the first target voltage level Vt1 (step S310). Next, the operating circuit performs a verification operation taking the erasing target voltage level Vt2 as a reference to lock on the target memory cells whose threshold voltage VT is greater than or equal to the erasing target voltage level Vt2 and perform an erasing operation (i.e., the erasing operation E2 shown in FIG. 2B) thereon (step S320). Next, the operating circuit performs a verification operation taking the erasing threshold voltage level Vh as a reference to lock on the target memory cells whose threshold voltage VT is less than the erasing threshold voltage level Vh and perform the post-programming operation P thereon (step S330). The above processes may include multiple times of programming, erasing, and verification operations.

Figure 10:
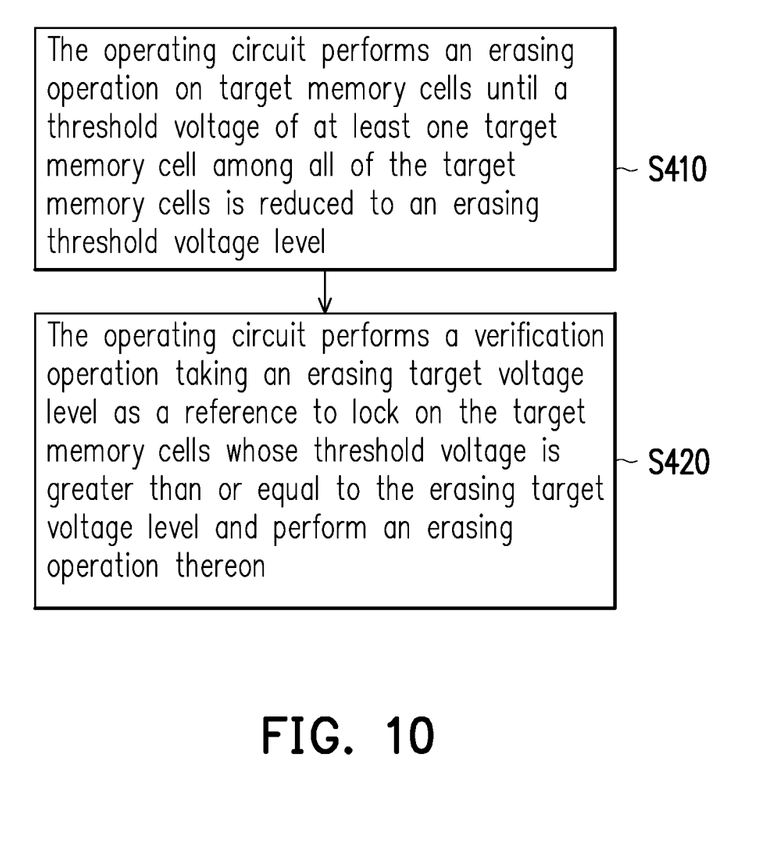
FIG. 10 is a flowchart of steps of performing the second embodiment by the operating circuit.

FIG. 10 is a flowchart of steps of performing the second embodiment by the operating circuit. With reference to FIG. 4A to FIG. 4C and FIG. 10 together, first, the operating circuit performs an erasing operation on target memory cells (i.e., the erasing operation E1 as shown in FIG. 4A) until a threshold voltage of at least one target memory cell among all of the target memory cells is reduced to the erasing threshold voltage level Vh (step S410). Next, the operating circuit performs a verification operation taking the erasing target voltage level Vt2 as a reference to lock on the target memory cells whose threshold voltage VT is greater than or equal to the erasing target voltage level Vt2 and perform an erasing operation (i.e., the erasing operation E2 as shown in FIG. 4B) thereon (step S420). The above processes may include multiple times of erasing and verification operations.

Figure 11:
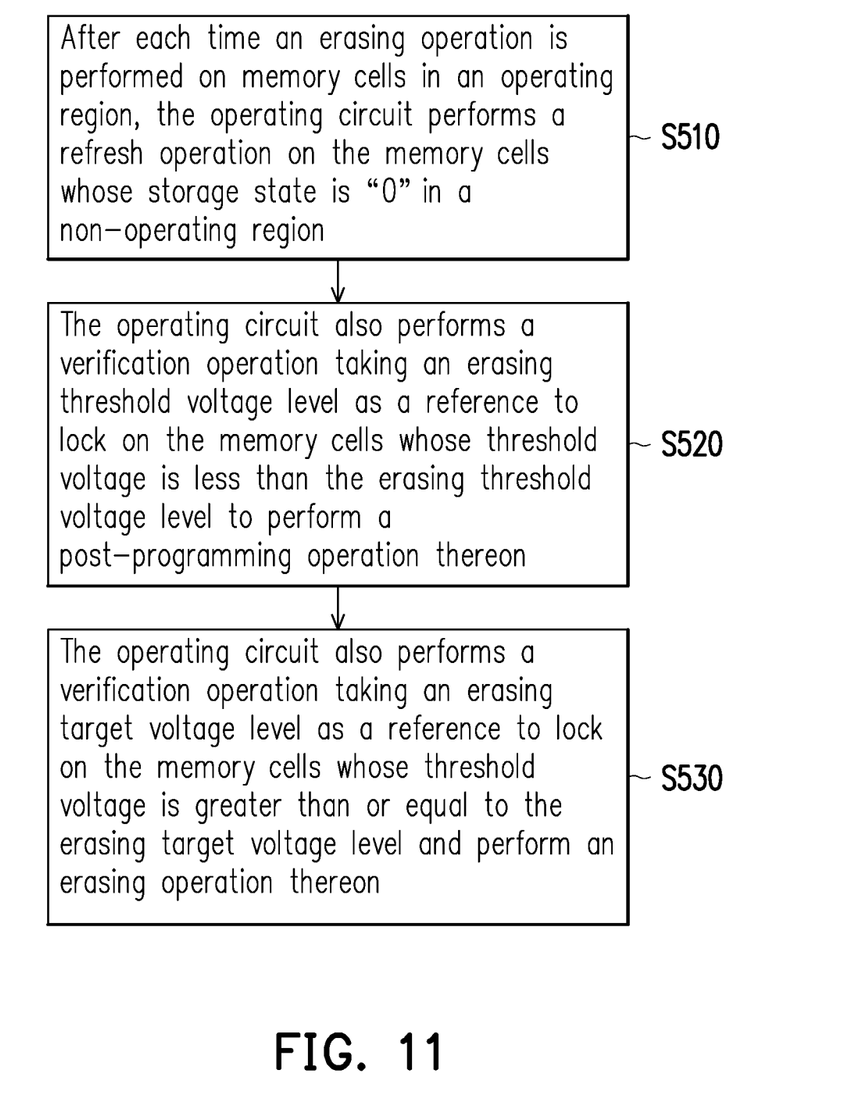
FIG. 11 is a flowchart of steps of performing the third embodiment by the operating circuit.

FIG. 11 is a flowchart of steps of performing the third embodiment by the operating circuit. With reference to FIG. 6C to FIG. 6E and FIG. 11 together, after each time an erasing operation is performed on memory cells in an operating region (e.g., the sector A of FIG. 5), the operating circuit performs a refresh operation on the memory cells whose storage state is "0" in a non-operating region (e.g., the sector B of FIG. 5) (step S510). The operating circuit also performs a verification operation taking the erasing threshold voltage level Vh as a reference to lock on the memory cells whose threshold voltage is less than the erasing threshold voltage level Vh to perform the post-programming operation P thereon (step S520). The operating circuit also performs a verification operation taking the erasing target voltage level Vt2 as a reference to lock on the memory cells whose threshold voltage is greater than or equal to the erasing target voltage level Vt2 and perform the erasing operation E2 thereon (step S530). The above processes may include multiple times of programming, erasing, and verification operations.

In terms of hardware, the blocks of the operating circuit may be implemented in a logic circuit of an integrated circuit. The relevant functions of the operating circuit may be implemented as hardware by utilizing hardware description languages (e.g., Verilog HDL or VHDL) or other suitable programming languages. For example, the relevant functions of the operating circuit may be implemented in one or more controllers, a microcontroller, a microprocessor, an application-specific integrated circuit (ASIC), a digital signal processor (DSP), a field programmable gate array (FPGA), and/or various logic blocks, modules, and circuits in other processing units. In the disclosure, the thresholds (e.g., the first target voltage level Vt1, the erasing target voltage level Vt2, and the erasing threshold voltage level Vh) may be determined as actually required, and may be stored in the operating circuit in the form of software or firmware. However, in other embodiments, the operating circuit may be additionally coupled to a commonly used storage device to store the thresholds. In an embodiment, the operating circuit may be integrated into the hardware architecture of a current controller, and a specific-purpose logic circuit may be employed as the controller. In another embodiment, the controller may include a general-purpose processor for executing a computer program to control the operation of the device. In another embodiment, a combination of a specific-purpose logic circuit and a general-purpose processor may be employed as the controller.

In summary of the foregoing, in both the first embodiment and the second embodiment of the disclosure, over erasing of the memory cells in the erasing procedure can be solved, and the distribution of the threshold voltages of the target memory cells can be maintained in a narrow range. In the first embodiment, the erasing operation E1 is first performed taking the first target voltage level (greater than the erasing target voltage level Vt2) as a reference, in which the number of over erased target memory cells can be reduced. In addition, the number of target memory cells that require to be performed with the post-programming operation can also be reduced. Moreover, in the first embodiment, since the erasing operation E2 is performed only on the selected target memory cells, it may not cause an overly great burden on the charge pump.

Further, in the second embodiment, the erasing operation is directly performed taking the erasing threshold voltage level as a reference to ensure that the threshold voltage of at least one target memory cell is moved down to the erasing threshold voltage level. In other words, during the erasing operation, there may not exist any target memory cell whose threshold voltage is less than the erasing threshold voltage level. In the second embodiment, the over erasing of the target memory cells and the leakage current of the over erased target memory cells are fundamentally solved. Obviously, in the second embodiment, the post-programming operation is not required to be performed, and the time of the erasing operation can be reduced.

In the third embodiment, an operation similar to the erasing operation E2 of the first embodiment and the second embodiment are also employed. Through the refresh operation, the post-programming operation, and the operation similar to the erasing operation E2, during the programming and erasing operations on the memory cells in the operating region, the extent to which the storage state of the memory cells in the non-operating region is affected can be reduced. Furthermore, the distribution of the threshold voltages of the target memory cells can similarly be maintained in a narrow range.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An erasing operation method of non-volatile memory, the method comprising:
    performing a first erasing operation, comprising reducing a threshold voltage of each of a plurality of memory cells of the non-volatile memory through a first erasing pulse;
    performing a first verification operation to confirm whether the threshold voltage of each of the plurality of memory cells is less than an erasing target voltage level;
    performing a second erasing operation in response to at least one of the plurality of memory cells failing the first verification operation, comprising:
    selecting the at least one memory cell failing the first verification operation; and
    reducing the threshold voltage of the at least one memory cell failing the first verification operation to be less than the erasing target voltage level through a second erasing pulse.

2. The method as recited in claim 1, wherein the first erasing operation comprises injecting holes into a floating gate of each of the plurality of memory cells through a hole injection method of Fowler-Nordheim tunneling, to reduce the threshold voltage of each of the plurality of memory cells.

3. The method as recited in claim 1, wherein the second erasing operation comprises injecting holes into a floating gate of each of the plurality of memory cells through a hole injection method of band to band hot hole injection, to reduce the threshold voltage of each of the plurality of memory cells.

4. The method as recited in claim 1, wherein the non-volatile memory is a NOR flash memory.

5. The method as recited in claim 1, further comprising:
    performing a second verification operation before performing the first verification operation to confirm whether the threshold voltage of each of the plurality of memory cells is less than a first target voltage level, and ending the first erasing operation when each of the plurality of memory cells passes the second verification operation, wherein the first target voltage level is greater than the erasing target voltage level.

6. The method as recited in claim 5, further comprising:
    in response to any one of the plurality of memory cells failing the second verification operation, applying the first erasing pulse to the plurality of memory cells again until the threshold voltage of each of the plurality of memory cells is less than the first target voltage level.

7. The method as recited in claim 1, wherein after the step of performing the second erasing operation, the method further comprises:
    performing a second verification operation to confirm whether the threshold voltage of each of the plurality of memory cells is not less than an erasing threshold voltage level, wherein the erasing threshold voltage level is less than the erasing target voltage level; and
    selecting at least one of the plurality of memory cells that fails the second verification operation to perform a post-programming operation to increase the threshold voltage of the at least one memory cell to the erasing threshold voltage level.

8. The method as recited in claim 1, further comprising:
    performing a second verification operation before performing the first verification operation to confirm whether the threshold voltage of any one of the plurality of memory cells is reduced to an erasing threshold voltage level, and ending the first erasing operation if the threshold voltage of any one of the plurality of memory cells is reduced to the erasing threshold voltage level, wherein the erasing threshold voltage level is less than the erasing target voltage level; and
    in response to the threshold voltage of each of the plurality of memory cells being greater than the erasing threshold voltage level, applying the first erasing pulse to the plurality of memory cells again until the threshold voltage of any one of the plurality of memory cells is reduced to the erasing threshold voltage level.

9. A non-volatile memory, comprising:
    a plurality of memory cells; and
    an operating circuit, configured to:
    perform a first erasing operation, comprising reducing a threshold voltage of each of the plurality of memory cells through a first erasing pulse;
    perform a first verification operation to confirm whether the threshold voltage of each of the plurality of memory cells is less than an erasing target voltage level; and
    perform a second erasing operation in response to at least one of the plurality of memory cells failing the first verification operation,
    wherein the second erasing operation comprises selecting the at least one of the plurality of memory cells failing the first verification operation by the operating circuit, and reducing the threshold voltage of the at least one of the plurality of memory cells failing the first verification operation to be less than the erasing target voltage level through a second erasing pulse.

10. The non-volatile memory as recited in claim 9, wherein the first erasing operation comprises injecting holes into a floating gate of each of the plurality of memory cells through a hole injection method of Fowler-Nordheim tunneling, to reduce the threshold voltage of each of the plurality of memory cells.

11. The non-volatile memory as recited in claim 9, wherein the second erasing operation comprises injecting holes into a floating gate of each of the plurality of memory cells through a hole injection method of band to band hot hole injection, to reduce the threshold voltage of each of the plurality of memory cells.

12. The non-volatile memory as recited in claim 9, wherein the non-volatile memory is a NOR flash memory.

13. The non-volatile memory as recited in claim 9, wherein the operating circuit performs a second verification operation before performing the first verification operation to confirm whether the threshold voltage of each of the plurality of memory cells is less than a first target voltage level, and ends the first erasing operation when each of the plurality of memory cells passes the second verification operation, wherein the first target voltage level is greater than the erasing target voltage level.

14. The non-volatile memory as recited in claim 13, wherein the operating circuit applies the first erasing pulse to the plurality of memory cells repeatedly in response to any one of the plurality of memory cells failing the second verification operation until the threshold voltage of each of the plurality of memory cells is less than the first target voltage level.

15. The non-volatile memory as recited in claim 9, wherein the operating circuit is further configured to perform a second verification operation after performing the second erasing operation to confirm whether the threshold voltage of each of the plurality of memory cells is not less than an erasing threshold voltage level, and the operating circuit selects at least one of the plurality of memory cells that fails the second verification operation to perform a post-programming operation to increase the threshold voltage of the at least one memory cell to the erasing threshold voltage level, wherein the erasing threshold voltage level is less than the erasing target voltage level.

16. The non-volatile memory as recited in claim 9, wherein the operating circuit performs a second verification operation before performing the first verification operation to confirm whether the threshold voltage of any one of the plurality of memory cells is reduced to an erasing threshold voltage level, and ends the first erasing operation if the threshold voltage of any one of the plurality of memory cells is reduced to the erasing threshold voltage level, wherein the erasing threshold voltage level is less than the erasing target voltage level; and wherein in response to the threshold voltage of each of the plurality of memory cells being greater than the erasing threshold voltage level, the operation circuit applies the first erasing pulse to the plurality of memory cells repeatedly until the threshold voltage of any one of the plurality of memory cells is reduced to the erasing threshold voltage level.

\* \* \* \* \*